(12) United States Patent
Yang et al.

(10) Patent No.: US 12,477,841 B2
(45) Date of Patent: Nov. 18, 2025

(54) SEMICONDUCTOR IMAGE-SENSING STRUCTURE AND METHOD FOR FORMING THE SAME

(71) Applicant: TAIWAN SEMICONDUCTOR MANUFACTURING COMPANY LTD., Hsinchu (TW)

(72) Inventors: Sung-Hsin Yang, Tainan (TW); Jung-Chi Jeng, Tainan (TW); Ru-Shang Hsiao, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 639 days.

(21) Appl. No.: 17/697,542

(22) Filed: Mar. 17, 2022

(65) Prior Publication Data

US 2023/0299117 A1 Sep. 21, 2023

(51) Int. Cl.
*H10F 39/00* (2025.01)
*H10F 39/18* (2025.01)

(52) U.S. Cl.
CPC ........... *H10F 39/014* (2025.01); *H10F 39/18* (2025.01); *H10F 39/802* (2025.01); *H10F 39/8037* (2025.01)

(58) Field of Classification Search
CPC ......... H01L 27/14689; H01L 27/14603; H01L 27/14612; H01L 27/14643
See application file for complete search history.

(56) References Cited

U.S. PATENT DOCUMENTS

| | | | | |
|---|---|---|---|---|
| 2005/0167750 A1* | 8/2005 | Yang | .................... | H01L 27/1203 257/E21.703 |
| 2005/0285204 A1* | 12/2005 | Kim | ..................... | H01L 27/1203 257/401 |
| 2006/0081895 A1* | 4/2006 | Lee | .................... | H01L 29/66795 257/288 |
| 2006/0084195 A1* | 4/2006 | Lyu | .................... | H01L 27/14603 257/E27.131 |
| 2009/0221132 A1* | 9/2009 | Oba | ...................... | H01L 21/845 257/E21.09 |
| 2011/0012201 A1* | 1/2011 | Yagishita | ........... | H10D 30/6213 257/E27.111 |
| 2020/0119002 A1* | 4/2020 | Xie | .................... | H01L 29/66545 |
| 2020/0335401 A1* | 10/2020 | Fan | .................... | H01L 21/76895 |
| 2021/0305299 A1* | 9/2021 | Huang | .............. | H01L 29/66795 |

* cited by examiner

*Primary Examiner* — Thanh Luu
*Assistant Examiner* — Monica T Taba
(74) *Attorney, Agent, or Firm* — WPAT LAW; Anthony King

(57) ABSTRACT

A semiconductor image-sensing structure includes a semiconductor substrate having a sensor region and a circuitry region, a plurality of fin structures disposed in the circuitry region, a mesa structure disposed in the sensor region, a first gate structure disposed over the plurality of fin structures in the circuitry region, and a second gate structure disposed over the mesa structure in the sensor region. The plurality of fin structures and the mesa structure include a same semiconductor material.

20 Claims, 16 Drawing Sheets

SEMICONDUCTOR IMAGE-SENSING STRUCTURE AND METHOD FOR FORMING THE SAME

BACKGROUND

Semiconductor image sensors are used to sense radiation, such as light. Complementary metal-oxide-semiconductor (CMOS) image sensors (CIS) are widely used in various applications, such as digital cameras and mobile phone cameras. Such cameras utilize an array of pixels located in a substrate, including photodiodes and transistors that can absorb radiation projected toward the substrate and convert the sensed radiation into electrical signals.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
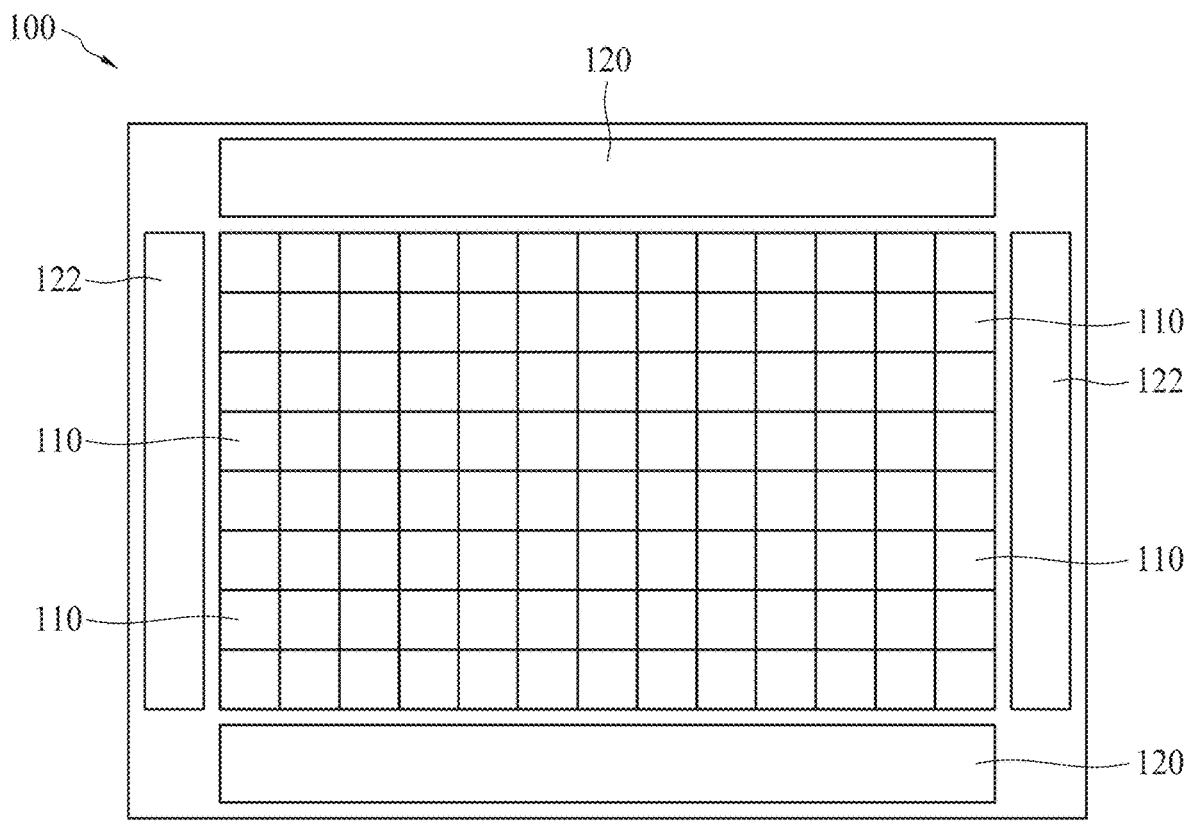
FIG. 1 shows a CMOS image sensor (CIS) architecture in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring to FIG. 1, an image sensor device 100 is provided. The image sensor device 100 may include an array of image-sensing elements 110 (e.g., pixels). In some embodiments, the image sensor device 100 may be a CIS or active pixel sensor. In some embodiments, the image sensor device 100 may be a charge coupled device (CCD) or passive pixel sensor. In some embodiments, the image sensor device 100 is a front-side illuminated (FSI) sensor device. In some alternative embodiments, the image sensor device 100 is a back-side illuminated (BSI) sensor device. The image sensor device 100 includes image-sensing elements 110 arranged in the array for measuring an intensity or brightness of radiation. In some embodiments, the image-sensing elements 110 may include photodiodes. In other embodiments, the image-sensing elements 110 may include pinned photodiodes. In some embodiments, photogate detectors, phototransistors, and/or other detectors known in the art may be used as the image-sensing elements 110. It should be understood that the image sensor device 100 will include many hundreds or thousands of image-sensing elements 110 in a sensor array area. In some embodiments, readout circuits 120 and pixel control circuits (i.e., logic drive circuits) 122 may be disposed at sides of the array of the image-sensing elements 110, as shown in FIG. 1, but the disclosure is not limited thereto. For simplicity, a single image-sensing element 110 is described in the present disclosure; however, typically an array of such image-sensing elements may form the image sensor device, as illustrated in FIG. 1.

Figure 2:
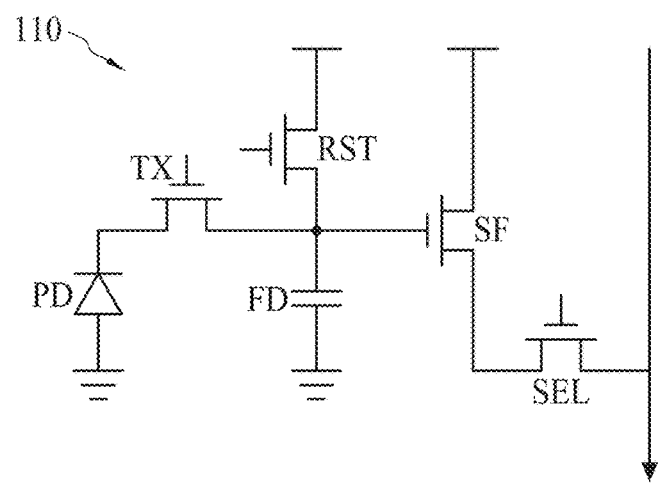
FIG. 2 is a schematic view of an image-sensing element in accordance with some embodiments of the present disclosure.

Referring to FIG. 2, in some embodiments, the image-sensing element 110 may include a reset transistor (RST), a source follower transistor (SF), a selector transistor (SEL), and a transfer transistor (Tx). In such embodiments, the image-sensing element 110 is referred to as a four-transistor structure, or a 4T structure. However, various other configurations are possible, including, for example, a 3T structure or a 5T structure. Additional circuitry and input/outputs such as the readout circuits 120 and the pixel control circuits 122 are typically provided adjacent to the array of image-sensing elements 110 for providing an operation environment for the image-sensing elements 110 and for supporting external communications with the image-sensing elements 110.

Still referring to FIG. 2, the image-sensing element 110 further includes a photo-sensing element (i.e., photodiode) PD. The photo-sensing element PD is electrically connected in series to the transfer transistor Tx. The transfer transistor Tx is electrically connected in series to the reset transistor RST. A gate of the source follower transistor SF is electrically connected to a source of the reset transistor RST, and a drain of the source follower transistor SF is electrically connected to a power supply. The selector transistor (SEL) is electrically connected in series to the source follower transistor SF. The reset transistor RST may act to reset the image-sensing element 110, e.g., by resetting a floating diffusion region (or a floating node) described below. The source follower transistor SF may allow a voltage of the image-sensing element 110 to be observed without removing an accumulated charge. The selector transistor SEL may be a row-select transistor and allow a single row of the image-sensing elements in an array, such as illustrated in the array of FIG. 1, to be read when the selector transistor SEL is turned on. The drain of the transfer transistor Tx includes a floating diffusion region, described below. The transfer transistor Tx can move signal charges accumulated in the photo-sensing element PD to the floating diffusion region. For example, a transfer gate (or a gate of the transfer transistor Tx) controls a transfer of electrons between the photo-sensing element PD and the floating diffusion region. Because the floating diffusion region is coupled to the gate of the source follower transistor SF, if the selector transistor SEL is turned on (i.e. if the row is selected), then data is output from the image-sensing element 110.

Figures 3A, 3B:
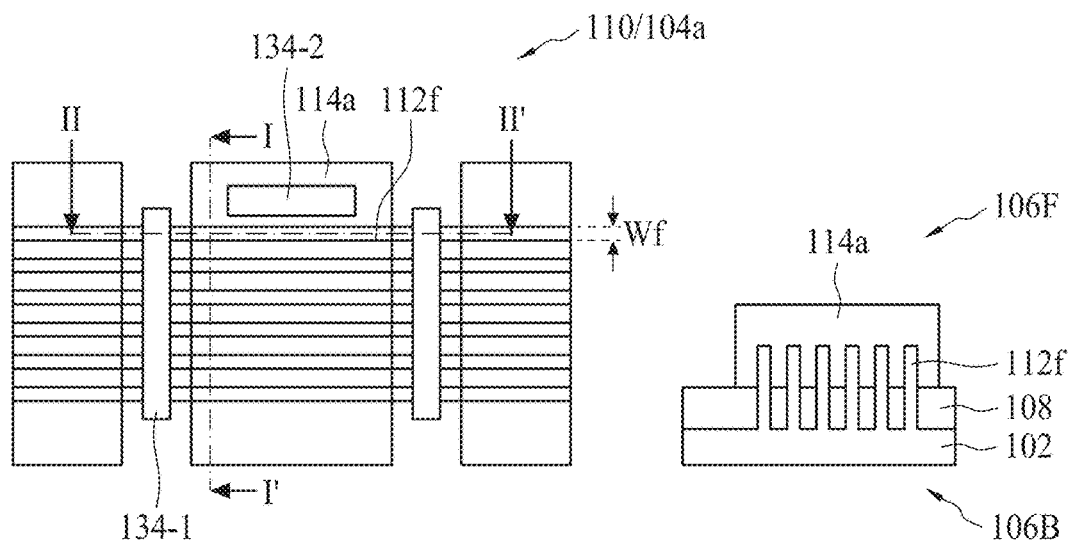
FIG. 3A shows a portion of an image-sensing element in accordance with some embodiments of the present disclosure.
FIG. 3B is a cross-sectional view taken along line I-I' of FIG. 3A.
Figure 3C:
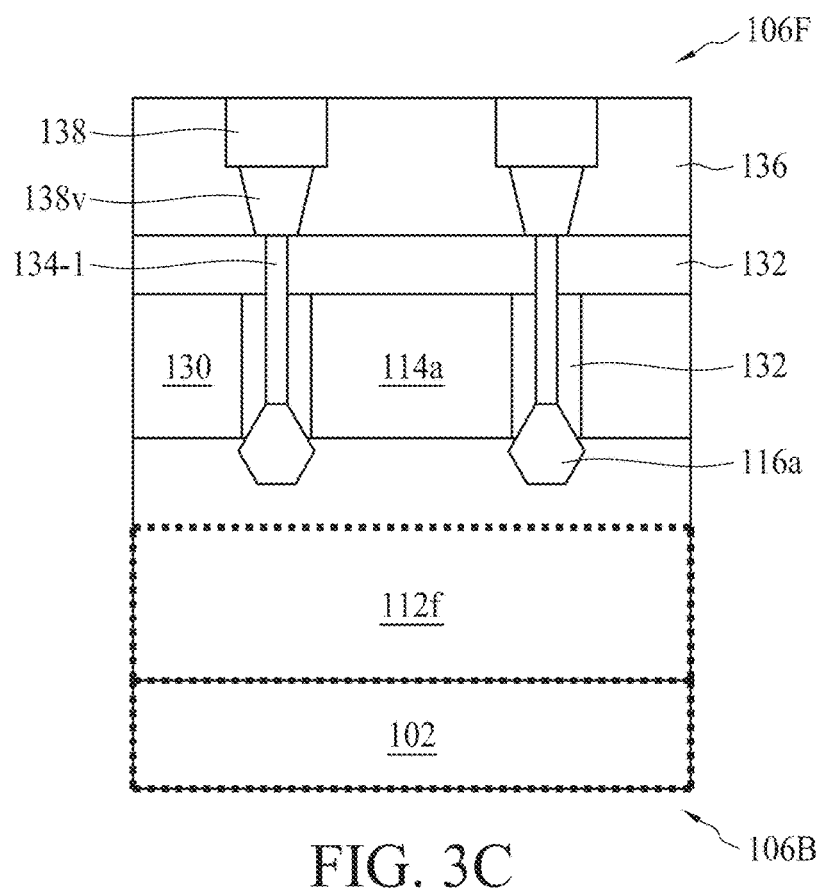
FIG. 3C is a cross-sectional view taken along line II-II' of FIG. 3A.
Figures 4A, 4B:
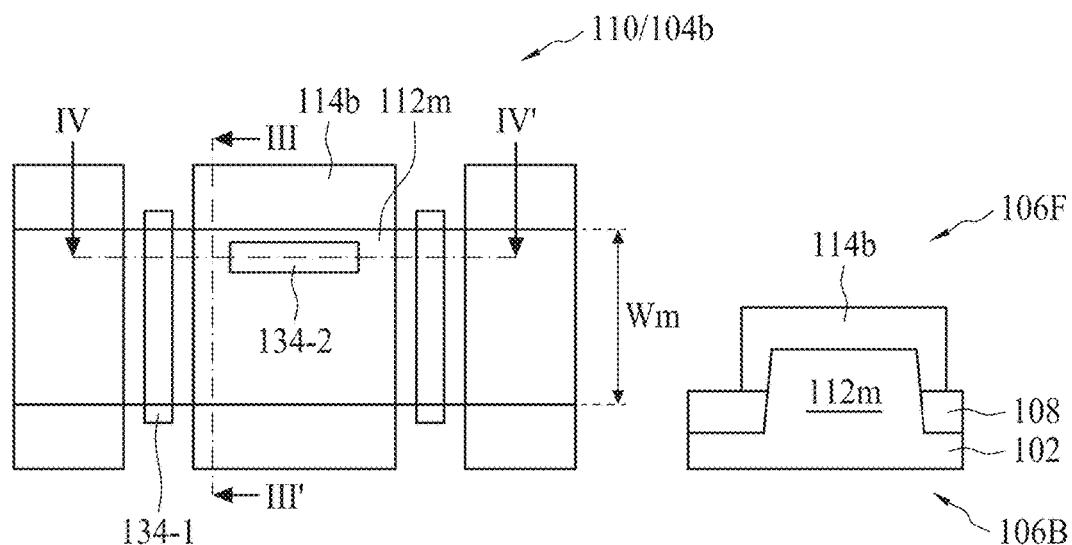
FIG. 4A shows a portion of an image-sensing element in accordance with some embodiments of the present disclosure.
FIG. 4B is a cross-sectional view taken along line III-III' of FIG. 4A.
Figure 4C:
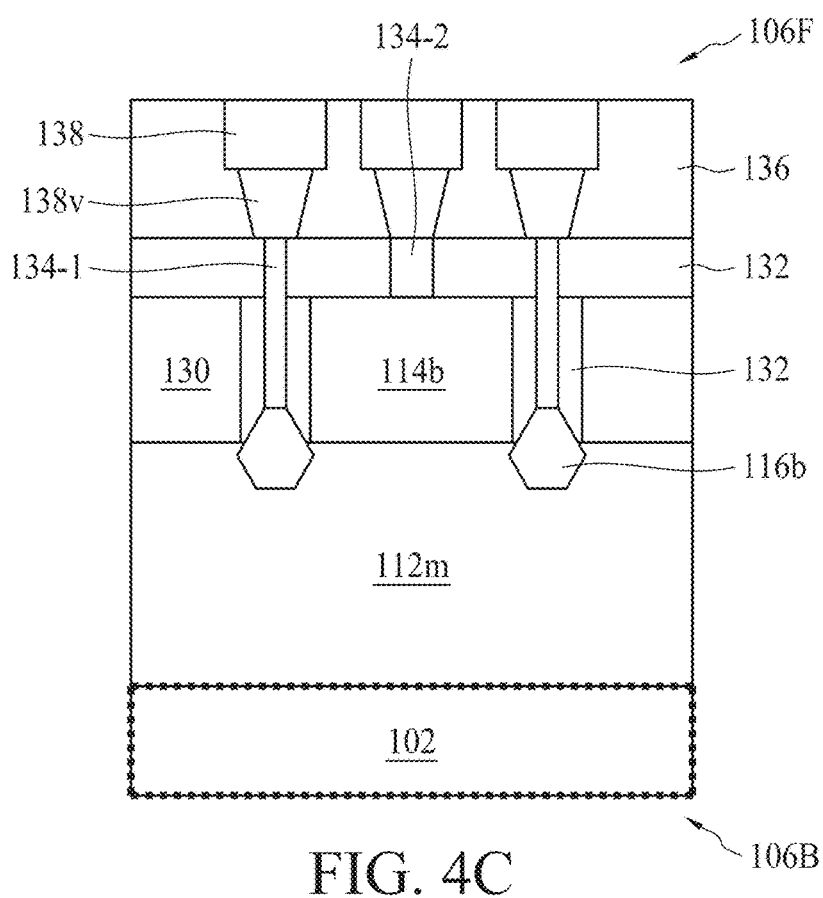
FIG. 4C is a cross-sectional view taken along line IV-IV' of FIG. 4A.

FIG. 3A shows a portion of an image-sensing element 110 in accordance with some embodiments of the present disclosure, FIG. 3B is a cross-sectional view taken along line I-I' of FIG. 3A, and FIG. 3C is a cross-sectional view taken along line II-II' of FIG. 3A. FIG. 4A shows a portion of an image-sensing element 110 in accordance with some embodiments of the present disclosure, FIG. 4B is a cross-sectional view taken along line III-III' of FIG. 4A, and FIG. 4C is a cross-sectional view taken along line IV-IV' of FIG. 4A. The image-sensing element 110 is formed on a semiconductor wafer that include hundreds or thousands of FSI or BSI integrated circuit devices arranged as individual dies on each semiconductor wafer. Processing steps and details not necessary to understanding the embodiments are omitted herein for clarity.

In some embodiments, a semiconductor substrate 102 has been provided and includes a circuitry region 104a and a sensor region 104b. As shown in FIGS. 3B, 3C, 4B and 4C, the semiconductor substrate 102 has a front side 106F and a back side 106B opposite to the front side 106F. The semiconductor substrate 102 may be formed of a semiconductor material such as silicon, germanium, diamond or similar materials. Compound materials used for semiconductor substrates such as silicon germanium, silicon carbide, gallium arsenide, indium arsenide, indium phosphide or combinations of these may be used. In alternative embodiments, the semiconductor substrate 102 may include a silicon on insulator (SOI) substrate.

In some embodiments, a plurality of fin structures 112f are disposed in the circuitry region 104a, while a mesa structure 112m is disposed in the sensor region 104b. As shown in FIGS. 3A and 4A, a width Wm of the mesa structure 112m is greater than a width Wf of each fin structure 112f. In some embodiments, the width Wm of the mesa structure 112m is at least 10 times the width Wf of the fin structure 112f. For example, the width Wf of each fin structure 112f may be between approximately 5 nanometers and 15 nanometers, and the width Wm of the mesa structure 112m may be between approximately 150 nanometers and 6000 nanometers. However, the width Wf of the fin structure 112f and the width Wm of the mesa structure 112m may be modified depending on various product requirements. In some embodiments, a height of each fin structure 112f and a height of the mesa structure 112m are substantially the same, but the disclosure is not limited thereto. In some embodiments, the fin structures 112f and the mesa structure 112m include a same semiconductor material. Further, the semiconductor substrate 102 has been processed using front end of the line (FEOL) operations to form a doped region serving as a photodiode in the sensor region 104b (i.e., in the mesa structure 112m) and a doped region serving as a well in the circuitry region 104a (i.e., in the fin structures 112f) prior to the forming of the fin structures 112f and the mesa structure 112m. Isolation structures 108 are shown between the fin structures 112f; these may be shallow trench isolations (STI). The isolation structures 108 may also formed to separate the fin structures 112f from the mesa structure 112m.

A gate structure 114a is disposed over the fin structures 112f in the circuitry region 104a, and a gate structure 114b is disposed over the mesa structure 112m in the sensor region 104b. In some embodiments, the gate structure 114a covers a portion of each fin structure 112f, and the gate structure 114b covers a portion of the mesa structure 112m. The gate structures 114a and 114b may include a gate dielectric layer and a gate conductive layer. In some embodiments, the gate conductive layer may be formed of a doped polysilicon material using deposition and patterning operations, or formed of metal using a replacement gate (RPG) operation.

A plurality of source/drain structures 116a are disposed at two sides of the gate structure 114a in the circuitry region 104a, and a source/drain structure 116b is disposed at two sides of the gate structure 114b in the sensor region 104b. In some embodiments, the source/drain structures 116a and 116b include epitaxial structures for providing stresses. In some embodiments, the epitaxial structures of the source/drain structures 116a may be separated from each other. In some embodiments, the epitaxial structures of the source/drain structures 116a may be coupled to each other, though not shown. In some embodiments, the source/drain structures 116a and the source/drain structure 116b include n-doped epitaxial structures. In such embodiments, heights of the source/drain structures 116a are greater than a height of the source/drain structure 116b. In some alternative embodiments, the source/drain structures 116a and the source/drain structure 116b include p-doped epitaxial structures. In such embodiments, the heights of the source/drain structures 116a are less than the height of the source/drain structure 116b. For example, the heights of the source/drain structures 116a are approximately 15 nanometers to approximately 35 nanometers less than the height of the source/drain structure 116b.

Additionally, dummy structures 130 may be disposed over two sides of the gate structures 114a and 114b, respectively. The abovementioned fin structures 112f, mesa structure 112m, doped regions in the fin structures 112f, and doped region in the mesa structure 112m, gate structures 114a and 114b, and dummy structures 130 may be formed using FEOL operations.

In some embodiments, a dielectric layer 132 may be formed over the semiconductor substrate 102. Further, a conductive structure 134-1 serving as a metal-to-drain (MD) is formed over and coupled to the source/drain structures 116a and the source/drain structure 116b, respectively. A conductive structure 134-2 serving as a metal-to-gate or a metal-to-poly (MP) is formed over and coupled to the gate structures 114a and 114b. In some embodiments, the dielectric layer 132 and the conductive structures 134-1, 134-2 may be formed using middle-end-of-line (MEOL) operations.

Figures 5A, 5B:
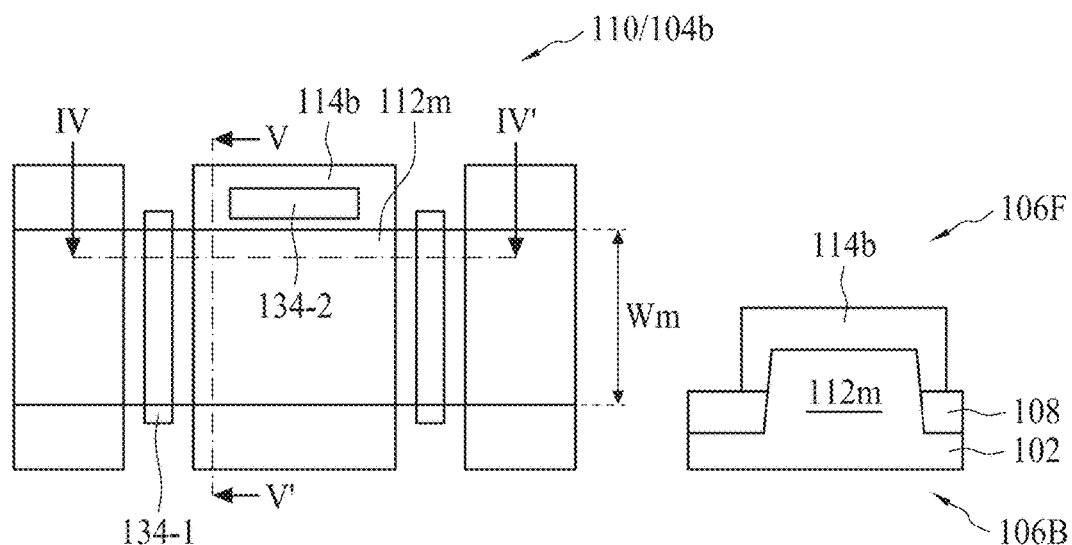
FIG. 5A shows a portion of an image-sensing element in accordance with some embodiments of the present disclosure.
FIG. 5B is a cross-sectional view taken along line V-V' of FIG. 5A.
Figure 5C:
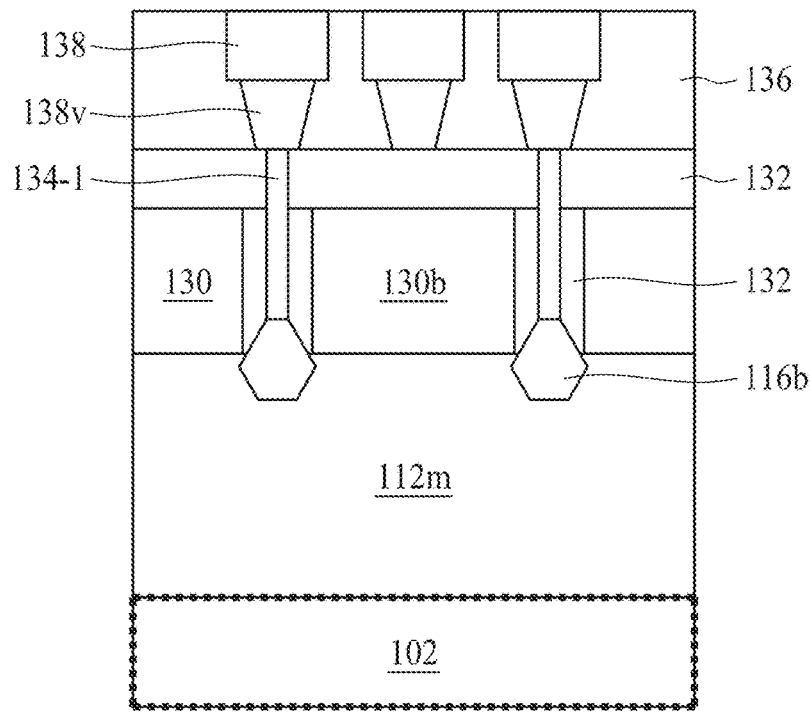
FIG. 5C is a cross-sectional view taken along line VI-VI' of FIG. 5A.

In some embodiments, the conductive structure 134-2 in the circuitry region 104a entirely overlaps the gate structure 114a, as shown in FIG. 3A. In some embodiments, the conductive structure 134-2 over the gate structure 114a may overlap a portion of the fin structure(s) 112f, but the disclosure is not limited thereto. For example, in some embodiments, the conductive structure 134-2 over the gate structure 114a may be entirely offset from the fin structures 112f, as shown in FIG. 3A. In some embodiments, the conductive structure 134-2 in the sensor region 104b entirely overlaps the gate structure 114b, as shown in FIGS. 4A and 5A. In some embodiments, the conductive structure 134-2 over the gate structure 114b may entirely overlap the mesa structure 112m, as shown in FIG. 4C. In some alternative embodiments, the conductive structure 134-2 over the gate structure 114b may be entirely offset from the mesa structure 112m, as shown in FIG. 5C.

Figure 6:
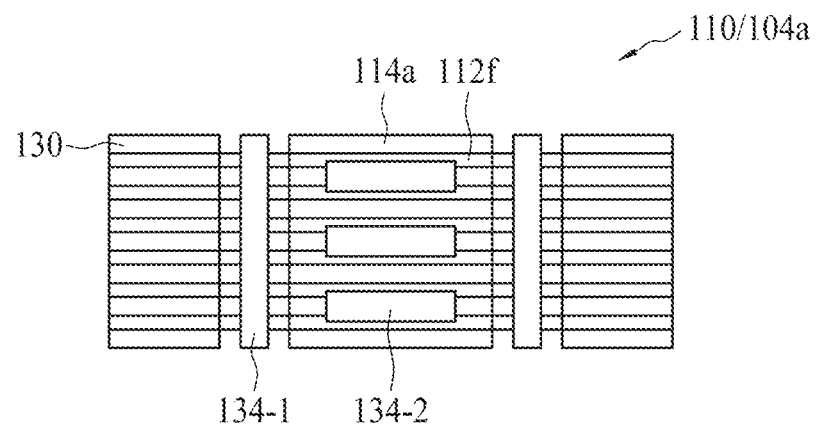
FIG. 6 is a schematic top view of a portion of a semiconductor image-sensing structure in accordance with some embodiments of the present disclosure.
Figure 7:
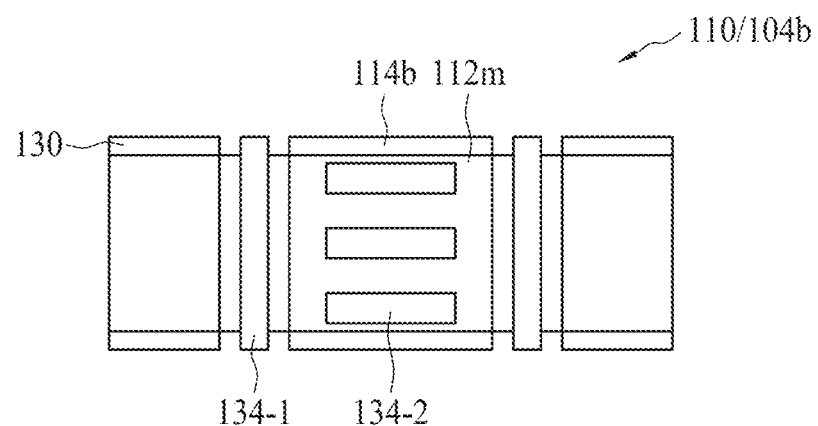
FIG. 7 is a schematic top view of a portion of a semiconductor image-sensing structure in accordance with some embodiments of the present disclosure.

In some embodiments, a number of the conductive structures 134-2 in the circuitry region 104a and the sensor region 104b may be modified depending on product requirements. For example, as shown in FIG. 6, a plurality of conductive structures 134-2 may be disposed over the gate structure 114a in the circuitry region 104a. Each conductive structure 134-2 may entirely overlap the gate structure 114a and partially overlap the fin structure(s) 112f. A plurality of conductive structures 134-2 may be disposed over the gate structure 114b in the sensor region 104b. Each conductive structure 134-2 may entirely overlap the gate structure 114b and the mesa structure 112m. When the conductive structures 134-2 overlap the fin structures 112f and the mesa structure 112m, dimensions of the gate structures 114a and 114b may be further reduced, thus improving miniaturization.

In some embodiments, a further dielectric layer 136 is formed over the conductive structures 134-1 and 134-2, and a plurality of conductive lines 138 and a plurality of via connectors 138v are formed in the dielectric layer 136. In some embodiments, the conductive lines 138 may be electrically connected to the conductive structures 134-1, 134-2 through the via connectors 138v. In some embodiments, the abovementioned dielectric layer 136, conductive lines 138 and via connectors 138v may be formed using back-end-of-line (BEOL) operations. The BEOL operations are further conducted to form a BEOL interconnect structure.

In some embodiments, the gate structure 114b, the mesa structure 112m and the source/drain structure 116b may form a transfer transistor device in the sensor region 104b, while the gate structure 114a, the fin structures 112f and the source/drain structures 116a may form a reset transistor device, a source follower transistor device and a selector transistor device in the circuitry region 104a. In some embodiments, the above-mentioned four transistor devices are electrically connected by the MEOL conductive structures and the BEOL interconnect structures to form a 4T pixel architecture for an image-sensing element 110, as shown in FIG. 1.

Figure 8A:
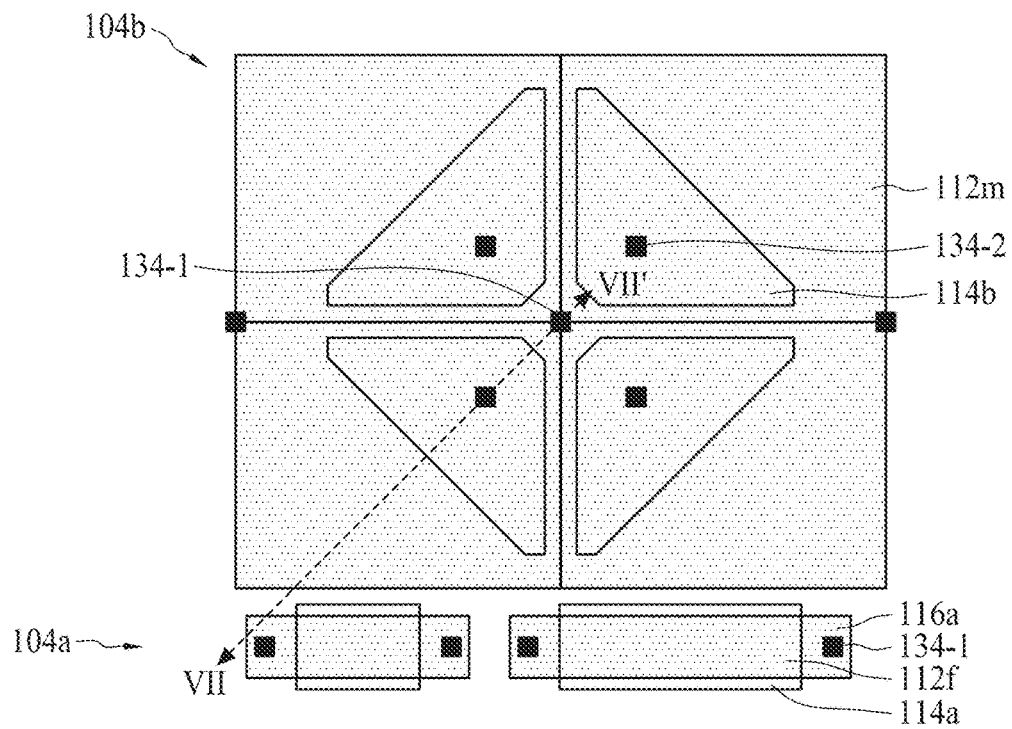
FIG. 8A is a schematic top view of a portion of a semiconductor image-sensing structure and FIG. 8B is a cross-sectional view taken along line VII-VII' of FIG. 8A in accordance with some embodiments of the present disclosure.
Figure 8B:
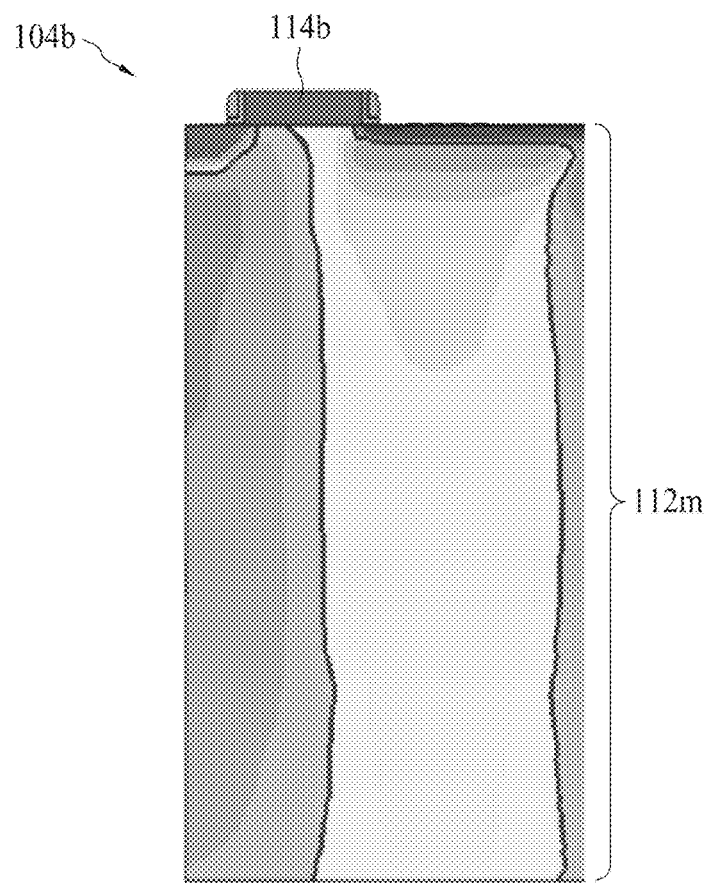

It should be understood that a layout of the transistor devices is not limited to that shown in FIGS. 3A to 7. Please refer to FIGS. 8A and 8B, wherein FIG. 8A is a top view of a portion of a semiconductor image-sensing structure and FIG. 8B is a cross-sectional view taken along line VII-VII' of FIG. 8A in accordance with some embodiments of the present disclosure. In some embodiments, the semiconductor image-sensing structure may include a large mesa structure 112m for improving performance of a transfer transistor device, and fin structures 112f for improving speed of a reset transistor device, the source follower transistor device and the selector transistor device. In some embodiments, a gate structure 114b is entirely disposed over the mesa structure 112m and covers a portion of the mesa structure 112m, as shown in FIGS. 8A and 8B.

Figure 9A:
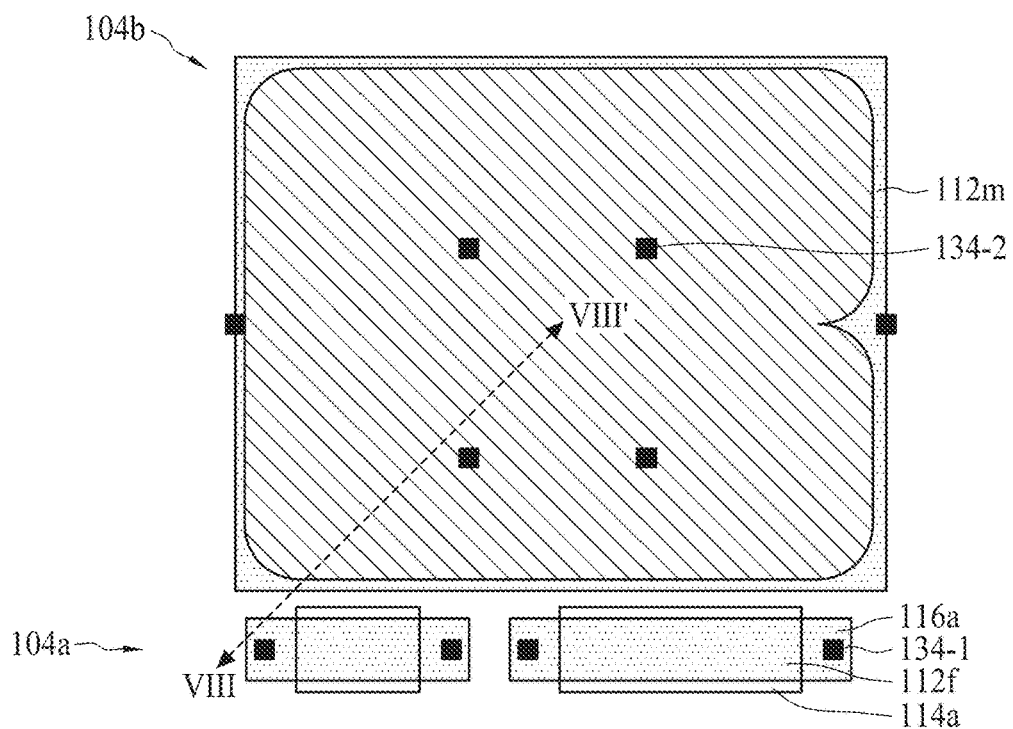
FIG. 9A is a schematic top view of a portion of a semiconductor image-sensing structure and FIG. 9B is a cross-sectional view taken along line VIII-VIII' of FIG. 9A in accordance with some embodiments of the present disclosure.
Figure 9B:
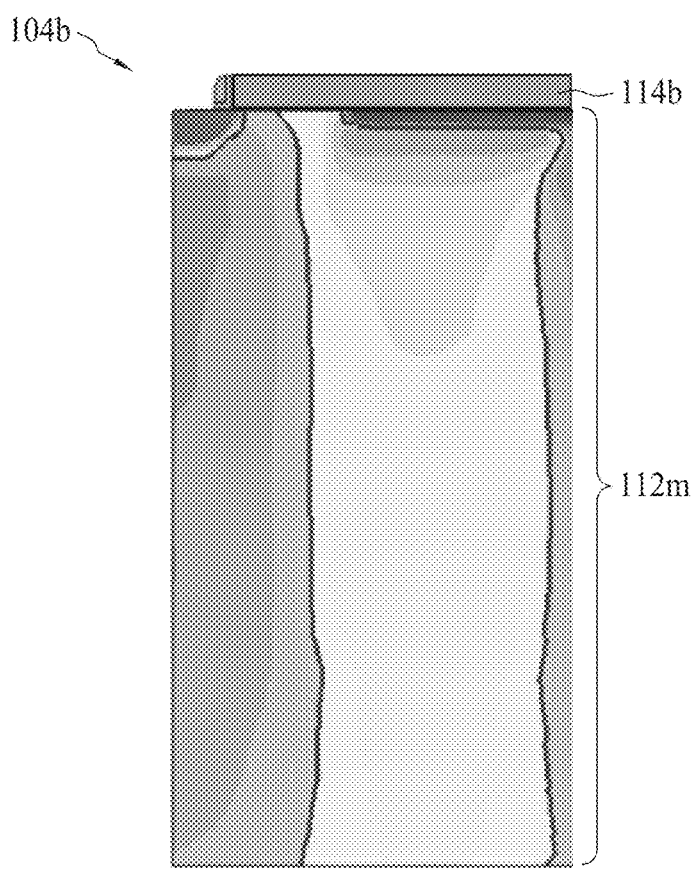

Please refer to FIGS. 9A and 9B, wherein FIG. 9A is a top view of a portion of a semiconductor image-sensing structure and FIG. 9B is a cross-sectional view taken along line VIII-VIII' of FIG. 9A in accordance with some embodiments of the present disclosure. In some embodiments, the semiconductor image-sensing structure may include a large mesa structure 112m for improving performance of a transfer transistor device, and fin structures 112f for improving speed of a reset transistor device, the source follower transistor device and the selector transistor device. In some embodiments, a gate structure 114b is entirely disposed over the mesa structure 112m and covers the mesa structure 112m almost entirely, as shown in FIGS. 9A and 9B. In some embodiments, a coverage ratio of the gate structure 114b to the mesa structure 112m may between approximately 30% and approximately 100%, but the disclosure is not limited thereto.

Figure 10A:
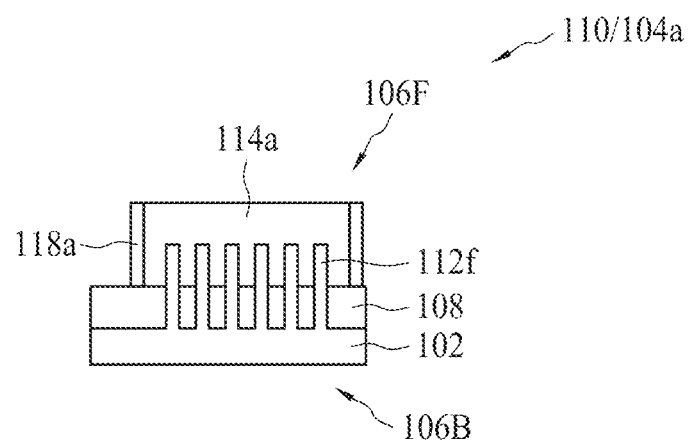
FIG. 10A is a cross-sectional view of a portion of a semiconductor image-sensing structure and FIG. 10B is a cross-sectional view of another portion of the semiconductor image-sensing structure in accordance with some embodiments of the present disclosure.
Figure 10B:
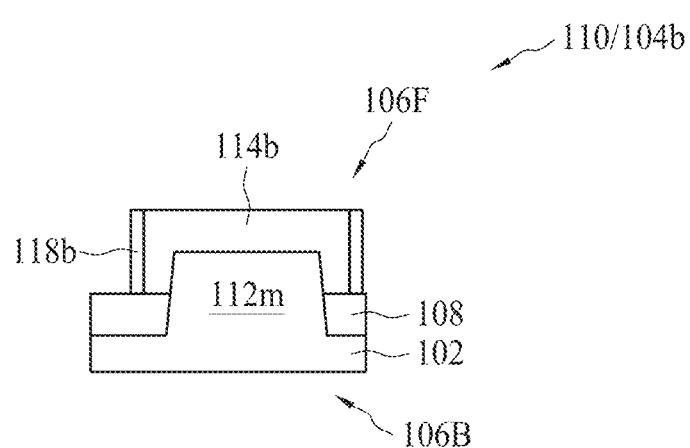
Figure 11A:
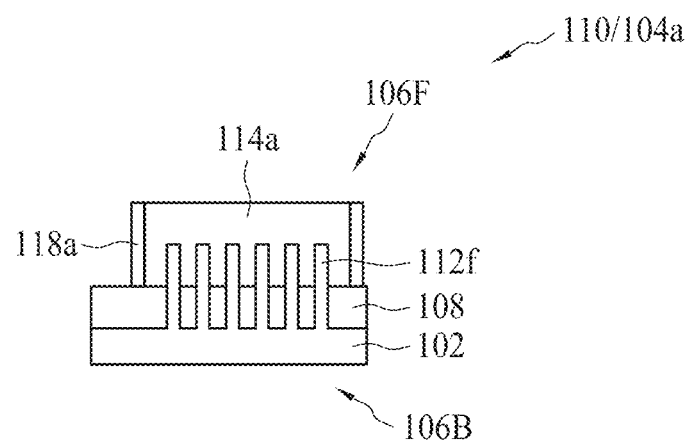
FIG. 11A is a cross-sectional view of a portion of a semiconductor image-sensing structure and FIG. 11B is a cross-sectional view of another portion of the semiconductor image-sensing structure in accordance with some embodiments of the present disclosure.
Figure 11B:
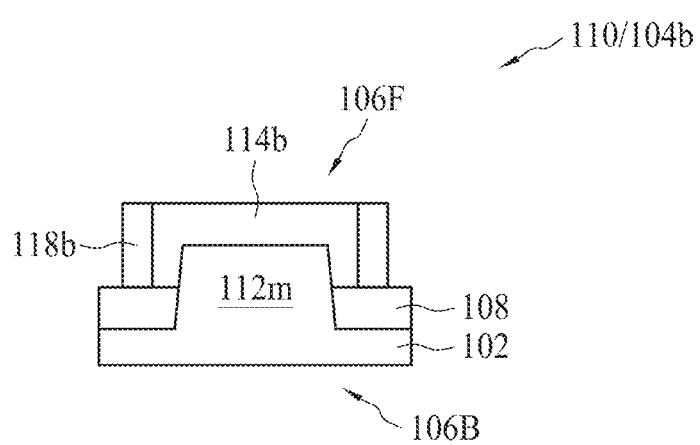

Pease refer to FIGS. 10A to 11B, wherein FIGS. 10A and 11A are cross-sectional views of a portion (i.e., a circuitry region 104a) of a semiconductor image-sensing structure 110, and FIGS. 10B and 11B are cross-sectional views of another portion (i.e., a sensor region 104b) of the semiconductor image-sensing structure 110 in accordance with some embodiments of the present disclosure. In some embodiments, a spacer 118a is formed over sidewalls of a gate structure 114a, and a spacer 118b is formed over sidewalls of a gate structure 114b. In some embodiments, a width of the spacer 118a and a width of the spacers 118b are similar, as shown in FIGS. 10A and 10B. In some embodiments, the width of the spacer 118b may be adjusted to comply with voltage requirements. In such embodiments, the width of the spacer 118b is increased when a greater voltage is needed. For example, the width of the spacer 118b for a transfer transistor device of 1.8V is less than the width of the spacer 118b for a transfer transistor device of 2.5V. The width of the spacer 118b for the transfer transistor device of 2.5V is less than the width of the spacer 118b of a transfer transistor device of 3.3V.

Figure 12:
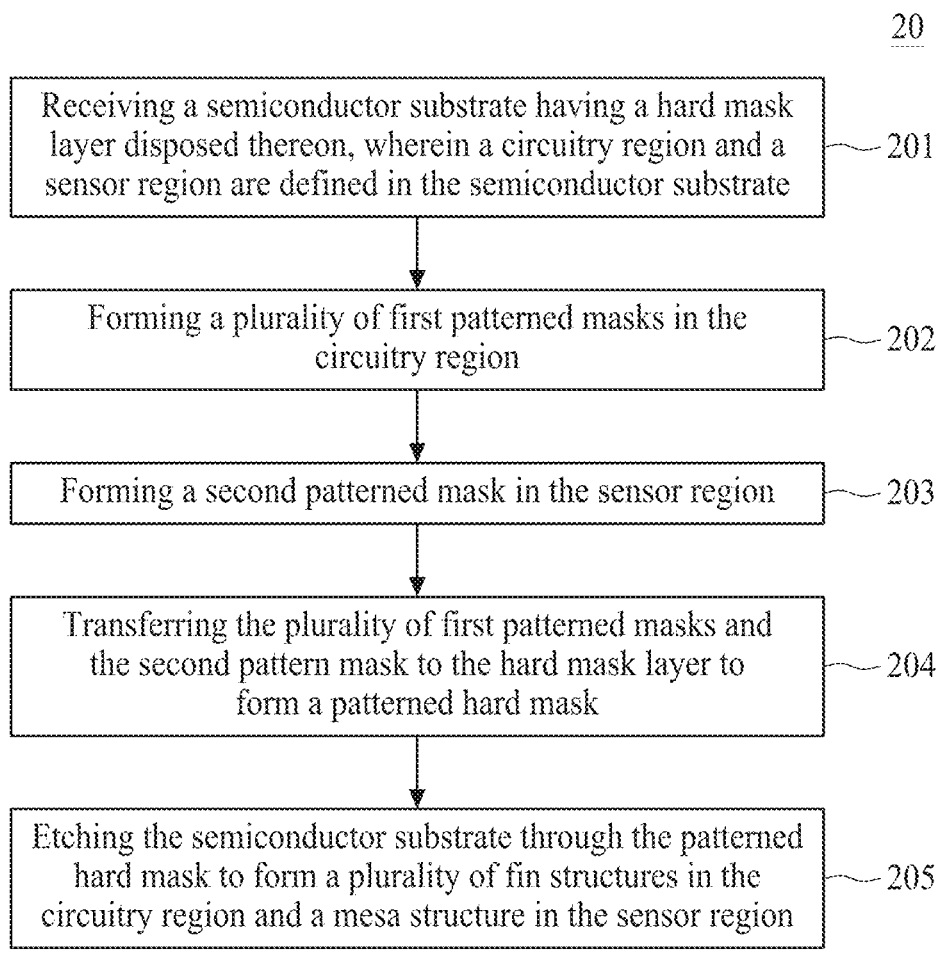
FIG. 12 shows a flowchart representing a method for forming a semiconductor image-sensing structure in accordance with some embodiments of the present disclosure.
Figure 13:
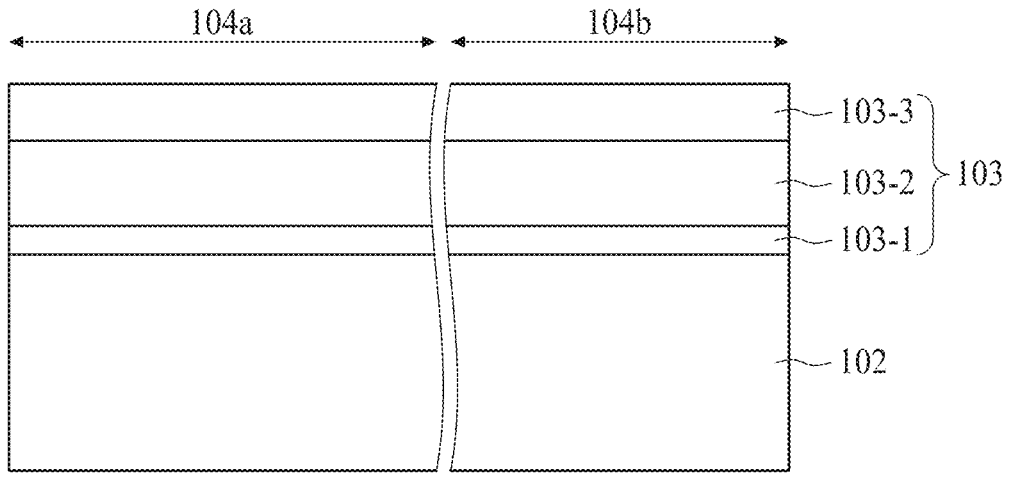
FIGS. 13 to 24 are schematic drawings illustrating a semiconductor image-sensing structure in various stages according to aspects of the present disclosure in one or more embodiments.

Please refer to FIG. 12, which shows a flowchart representing a method 20 for forming a semiconductor image-sensing structure in accordance with some embodiments of the present disclosure. In the present disclosure, a method of manufacturing a semiconductor image sensing structure is disclosed. In some embodiments, a semiconductor structure is formed by the method 20. The method 20 includes a number of operations (201, 202, 203, 204 and 205) and the description and illustration are not deemed as a limitation to the sequence of the operations. The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

Please also refer to FIGS. 13 to 24, which are schematic drawings of a semiconductor image-sensing structure in various stages according to aspects of the present disclosure in one or more embodiments. In operation 201, a semiconductor substrate 102 is received. A circuitry region 104a and a sensor region 104b are defined in the semiconductor substrate 102. Further, a hard mask layer 103 is formed on the semiconductor substrate 102. In some embodiments, the hard mask layer 103 is a multi-layered structure. For example, the hard mask layer 103 may include three layers 103-1, 103-2 and 103-3, but the disclosure is not limited thereto. In some embodiments, the layer 103-1 may be a silicon oxide layer, the layer 103-2 may be a silicon nitride layer, and the layer 103-3 may be a silicon oxide layer, but the disclosure is not limited thereto. In some embodiments, a thickness of the layer 103-2 is greater than thicknesses of the layers 103-1 and 103-3, while the thickness of the layer 103-3 is greater than the thickness of the layer 103-1, but the disclosure is not limited thereto.

Figure 14:
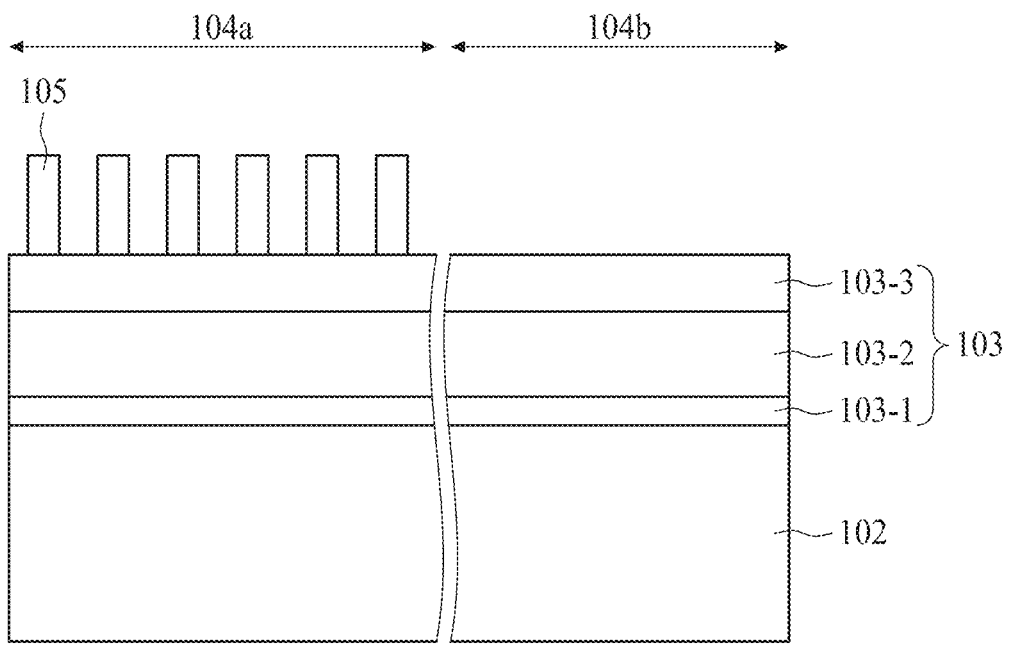

Referring to FIG. 14, in operation 202, a plurality of first patterned masks 105 are formed over the hard mask layer 103 in the circuitry region 104a. In some embodiments, the first patterned masks 105 include silicon nitride, but the disclosure is not limited thereto. The first patterned masks 105 may define dimensions and locations of a plurality of fin structures 112f as mentioned above, but the disclosure is not limited thereto.

Figure 15:
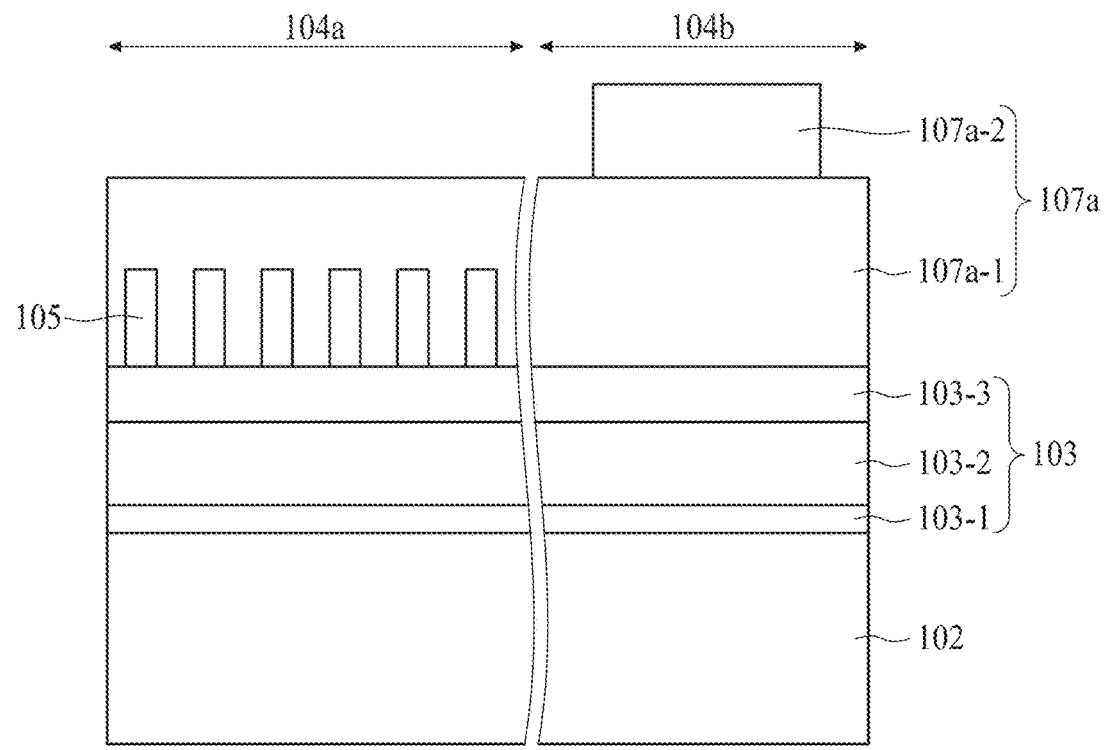

In operation 203, a second patterned mask 109 is formed over the hard mask layer 103 in the sensor region 104b. In some embodiments, the forming of the second patterned mask 109 includes further operations. For example, in some embodiments, a photoresist 107a is formed over the hard mask layer 103. The photoresist 107a covers the first patterned masks 105, as shown in FIG. 15. In some embodiments, the photoresist 107a may be a bi-layered structure. For example, the photoresist 107a may include a bottom layer 107a-1 and a top layer 107a-2. Subsequently, a photolithography operation is performed on the top layer 107a-2 of the photoresist 107a, thus forming a patterned top layer 107a-2, as shown in FIG. 15. In some embodiments, the photolithography operation may use a radiation of 248 nanometers, but the disclosure is not limited thereto. The patterned top layer 107a-2 may define a location of a mesa structure 112m as mentioned above, but the disclosure is not limited thereto. In some embodiments, a width of the patterned top layer 107a-2 may be greater than a width of the mesa structure 112m to be formed due to the etching bias.

Figure 16:
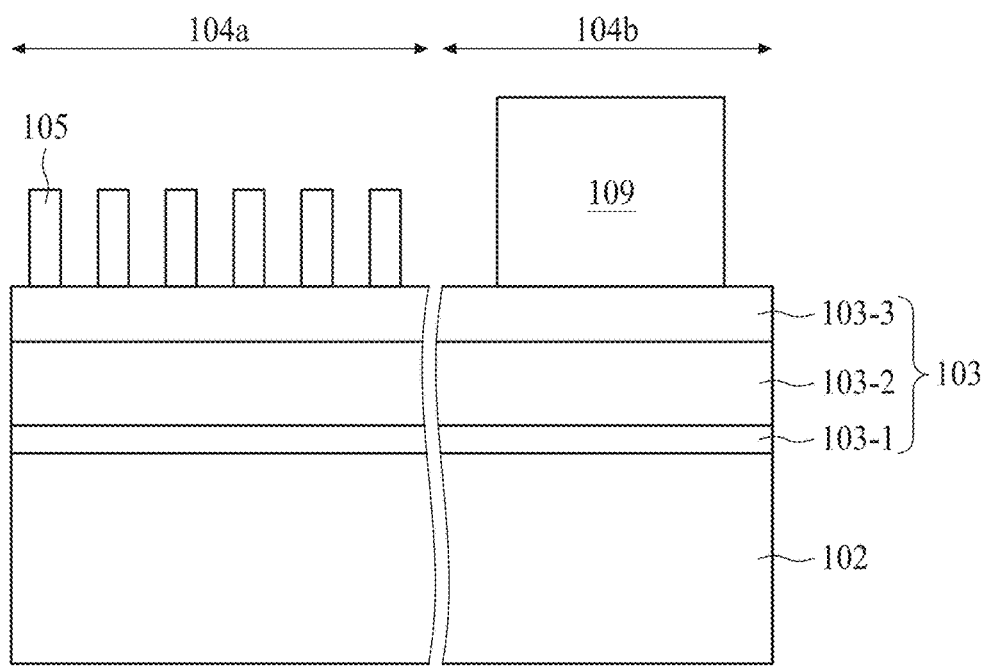

Referring to FIG. 16, the bottom layer 107a-1 is etched through the patterned top layer 107a-2, and thus the second patterned mask 109 is obtained in operation 203.

Figure 17:
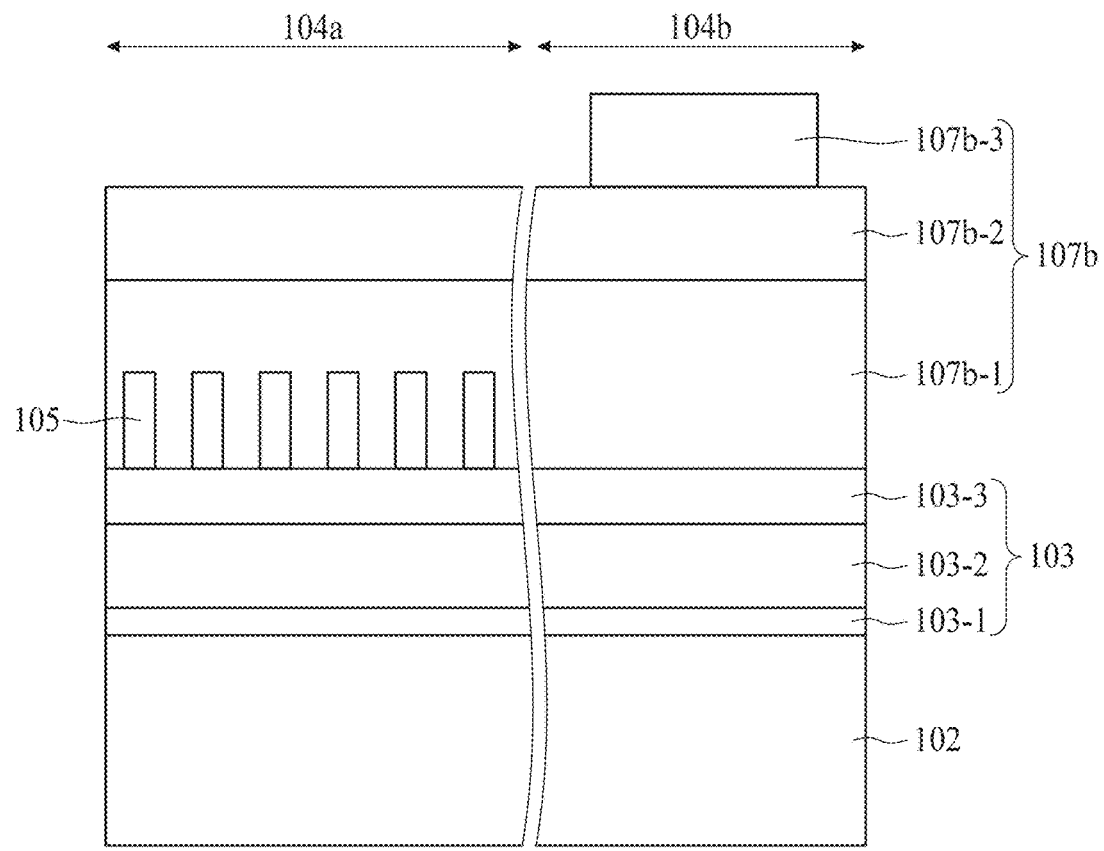

It should be note that operations for forming the second patterned mask 109 are not limited to those illustrated by FIGS. 15 and 16. Referring to FIG. 17, in other embodiments, a tri-layered photoresist layer 107b is formed over the hard mask layer 104. In some embodiments, the tri-layered photoresist layer 107b may include a bottom layer 107b-1, a middle layer 107b-2 and a top layer 107b-3. Subsequently, a photolithography operation is performed on the top layer 107b-3 of the photoresist layer 107b, thus forming a patterned top layer 107b-3, as shown in FIG. 17. In some embodiments, the photolithography operation may use a radiation of 193 nanometers, but the disclosure is not limited thereto. The patterned top layer 107b-3 may define a location and a dimension of the mesa structure 112m as mentioned above, but the disclosure is not limited thereto.

Figure 18:
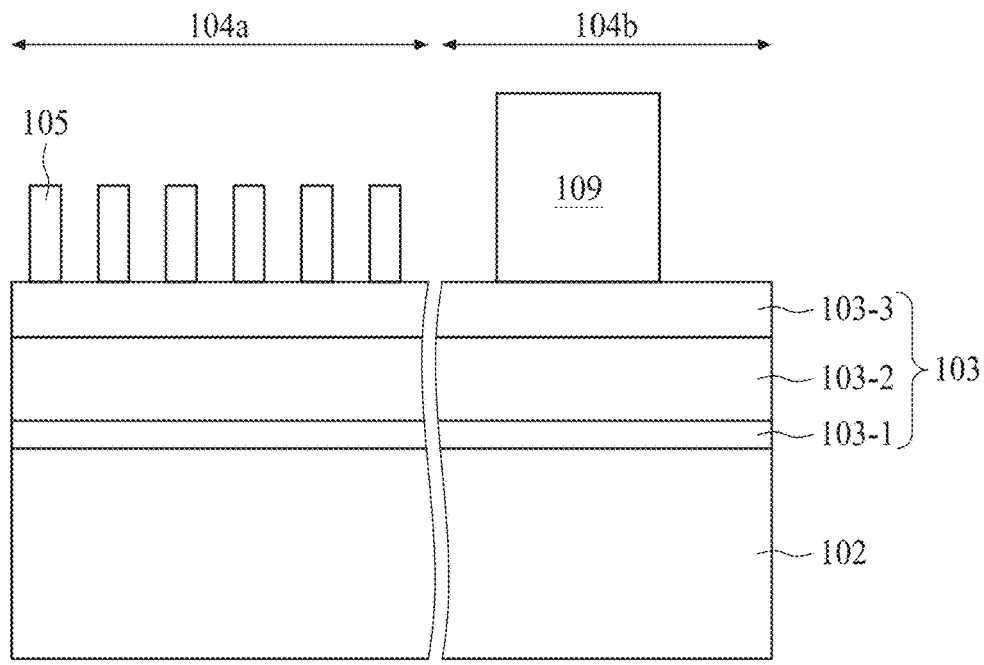

Referring to FIG. 18, the middle layer 107b-2 and the bottom layer 107a-1 are etched through the patterned top layer 107b-3, and thus the second patterned mask 109 is obtained in operation 203.

Figure 19:
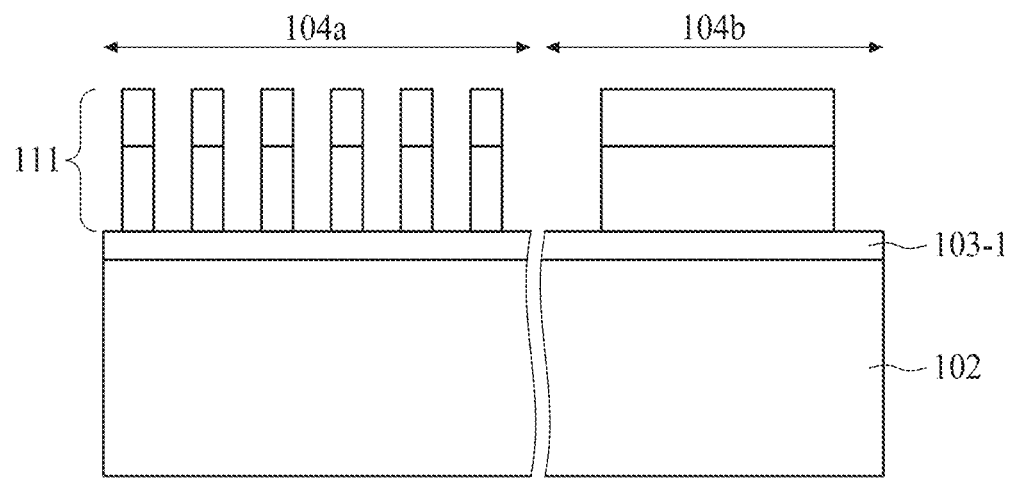

FIG. 19 is a schematic drawing illustrating the semiconductor image-sensing structure in a stage subsequent to that shown in FIGS. 16 and 18. In operation 204, the first patterned masks 105 and the second patterned mask 109 are transferred to the hard mask layer 103 to form a patterned hard mask 111. In some embodiments, a portion of the hard mask layer 103 (i.e., the layer 103-1) may be left and exposed through the patterned hard mask 111.

Figure 20:
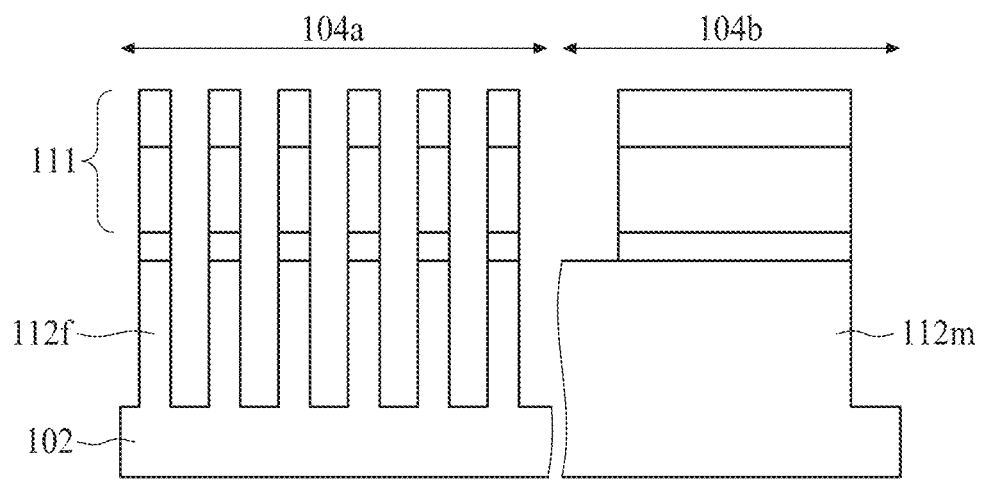

Referring to FIG. 20, in operation 205, the semiconductor substrate 102 is etched through the patterned hard mask 111 to form a plurality of fin structures 112f in the circuitry region 104a and a mesa structure 112m in the sensor region 104b. As mentioned above, a width of each fin structure 112f is less than the width of the mesa structure 112m. The fin structure 112f and the mesa structure 112m include a same semiconductor material. However, the fin structure 112f and the mesa structure 112m include different doped regions. For example, the fin structure 112f may have a doped region for forming a channel during operation, while the mesa structure 112m may have doped regions for serving as a photodiode.

Figure 21:
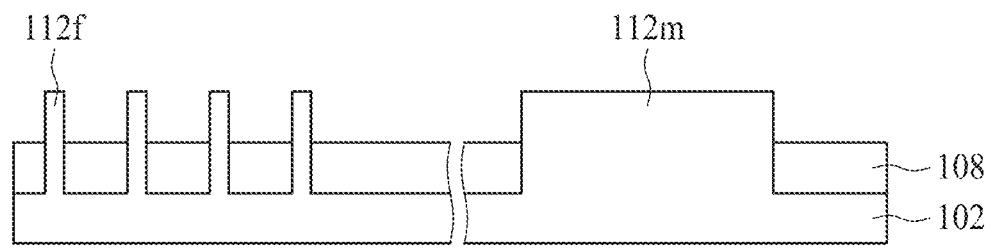

Referring to FIG. 21, the patterned hard mask 111 and layer 103-1 are removed after the forming of the fin structures 112f and the mesa structure 112m. Thereafter, isolation structures (i.e., STIs) 108 are formed over the semiconductor substrate 102. Thus, the mesa structure 112m is separated from the fin structures 112f, and the fin structures 112f are separated from each other by the isolation structures 108.

Figure 22:
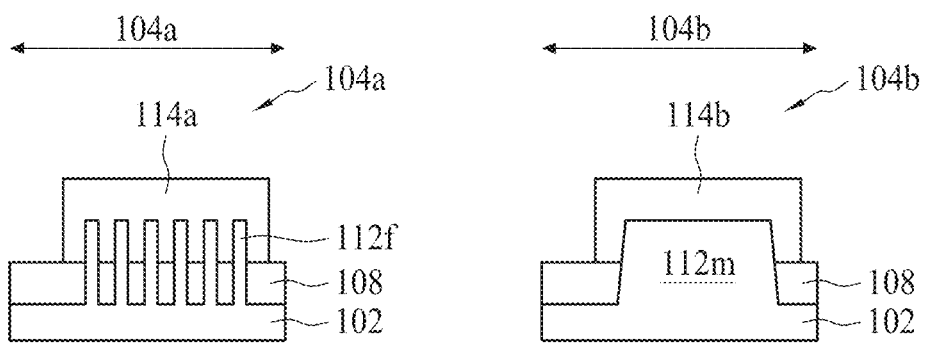

Referring to FIG. 22, a gate structure 114a is formed over the plurality of fin structures 112f in the circuitry region 104a, and a gate structure 114b is formed over the mesa structure 112m in the sensor region 104b. As mentioned above, an overlap ratio of the gate structure 114b to the mesa structure 112m and layouts of the gate structure 114b and the mesa structure 112m may vary depending on product requirements.

Figure 23:
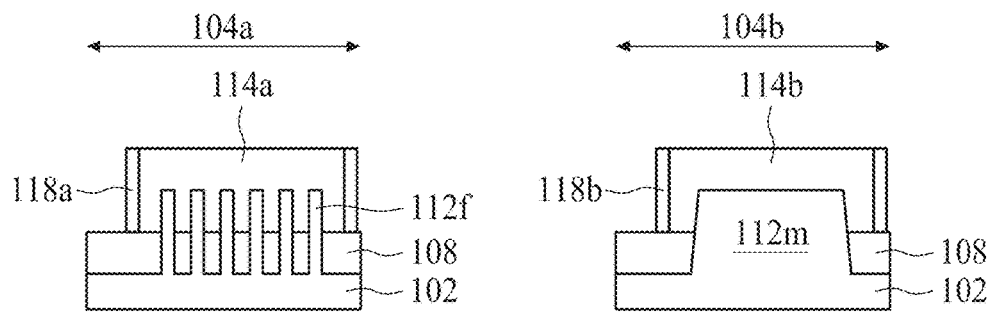

Referring to FIG. 23, a spacer 118a is formed over sidewalls of the gate structure 114a in the circuitry region 104a and a spacer 118b is formed over sidewalls of the gate structure 114b in the sensor region 104b. In some embodiments, a width of the spacer 118a and a width of the spacer 118b may be similar, as shown in FIG. 23. In other embodiments, when a greater voltage is required for a transfer transistor device, the width of the spacer 118b is greater than the width of the spacer 118a, as shown in FIGS. 11A and 11B. Repeated descriptions of such details are omitted in the interest of brevity.

Figure 24:
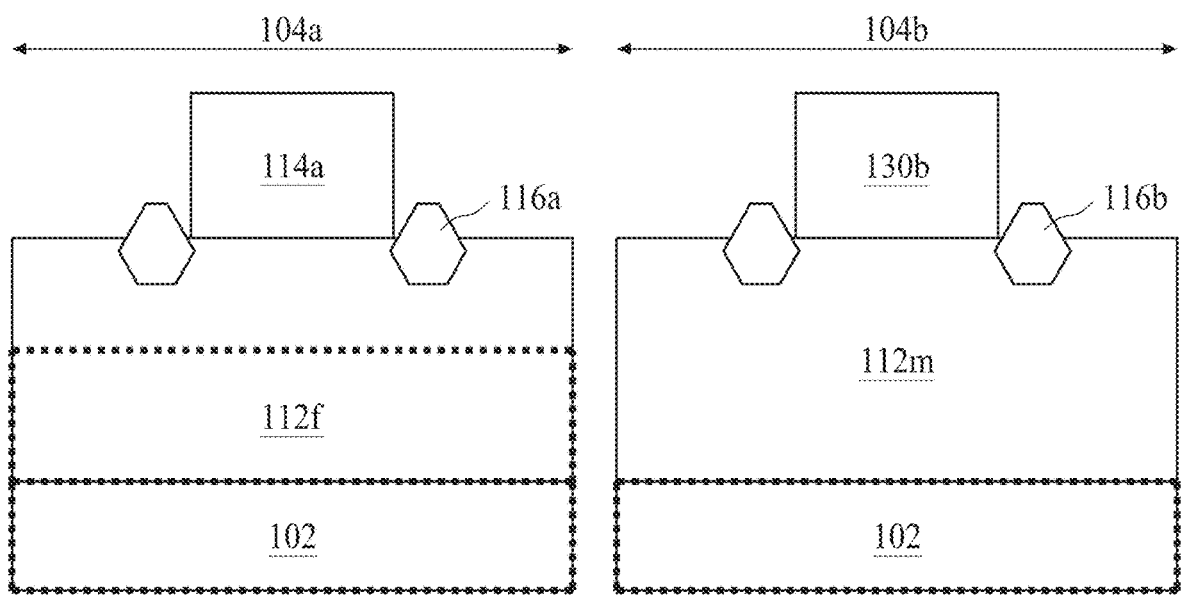

Please refer to FIG. 24, which is a cross-sectional view taken along a direction different from that of FIGS. 13 to 23. In some embodiments, FIGS. 13 to 23 are cross-sectional views taken along a first direction, and FIG. 24 is a cross-sectional view taken along a second direction different from the first direction. In some embodiments, the first direction is perpendicular to the second direction. In some embodiments, portions of each fin structure 112f are removed to form a plurality of recesses (not shown) in the circuitry region 104a, and portions of the mesa structure 112m are removed to form a plurality of recesses (not shown) in the sensor region 104b. Subsequently, a plurality of epitaxial structures are formed in the recesses in the circuitry region 104a, and a plurality of epitaxial structures are formed in the recesses in the sensor region 104b. Further, dimensions (i.e., heights) of the epitaxial structures in the circuitry region 104a are different from dimensions (i.e., heights) of the epitaxial structures in the sensor region 104b. The epitaxial structures in the circuitry region 104a and the sensor region 104b may serve as source/drain structures 116a and source/drain structures 116b, respectively. As mentioned above, the epitaxial structures of the source/drain structures 116a may be separated from each other. In some embodiments, the epitaxial structures of the source structures 116a may be coupled to each other, while the epitaxial structures of the drain structures 116a may be coupled to each other, though not shown. In some embodiments, the source/drain structures 116a and the source/drain structure 116b include n-doped epitaxial structures. In such embodiments, heights of the source/drain structures 116a are greater than a height of the source/drain structure 116b. In some alternative embodiments, the source/drain structures 116a and the source/drain structure 116b include p-doped epitaxial structures. In such embodiments, the heights of the source/drain structures 116a are less than the height of the source/drain structure 116b.

As mentioned above, the fin structures 112f, the mesa structure 112m, the doped regions in the fin structures 112f, the doped regions in the mesa structure 112m, the gate structures 114a and 114b, and the dummy structures 130 may be formed using FEOL operations. Subsequently, conductive structures may be formed using MEOL operations, and interconnect structures may be formed using BEOL operation. In some embodiments, the gate structure 114b, the mesa structure 112m and the source/drain structure 116b may form a transfer transistor device in the sensor region 104b, while the gate structure 114a, the fin structure 112f and the source/drain structures 116a may form a reset transistor device, a source follower transistor device and a selector transistor device in the circuitry region 104a. In some embodiments, the above-mentioned four transistor devices are electrically connected by the MEOL conductive structure and the BEOL interconnect structures to form a 4T pixel architecture for one image-sensing elements 110, as shown in FIG. 1.

In some embodiments, operations may be performed on the back side of the semiconductor substrate 102. Thus, passivations, optical elements such as color filters and micro lenses, and other suitable structures may be formed over the back side of the semiconductor substrate 102. Accordingly, a semiconductor image-sensing structure may be obtained.

In the present disclosure, a semiconductor image-sensing structure is provided. The semiconductor image-sensing structure includes the fin structures for a reset transistor device, a source follower transistor device and a selector transistor device, and a mesa structure for a transfer transistor device. The fin structures help improve speeds of the reset transistor device, the source follower transistor device and the selector transistor device, while the mesa structure helps improve a photoelectric effect of the transfer transistor device.

In some embodiments, a semiconductor image-sensing structure is provided. The semiconductor image-sensing structure includes a semiconductor substrate having a sensor region and a circuitry region, a plurality of fin structures disposed in the circuitry region, a mesa structure disposed in the sensor region, a first gate structure disposed over the plurality of fin structures in the circuitry region, and a second gate structure disposed over the mesa structure in the sensor region. The plurality of fin structures and the mesa structure include a same semiconductor material.

In some embodiments, a semiconductor image-sensing structure is provided. The semiconductor image-sensing structure includes a plurality of FinFET devices, and a transistor device. Each of the FinFET devices includes a plurality of fin structures and a gate structure over the plurality of fin structures. The transistor device includes a mesa structure and a gate structure over the mesa structure. The plurality of fin structures and the mesa structure include a same material. The plurality of FinFET devices and the transistor device are electrically connected to form an image-sensing device.

In some embodiments, a method for forming a semiconductor image-sensing structure is provided. The method includes following operations. A semiconductor substrate is received. The semiconductor substrate includes a circuitry region and a sensor region. A hard mask layer is formed over the semiconductor substrate. A plurality of first patterned masks are formed in the circuitry region. A second patterned mask is formed in the sensor region. The plurality of first patterned masks and the second patterned mask are transferred to the hard mask layer to form a patterned hard mask. The semiconductor substrate is etched to form a plurality of fin structures in the circuitry region and a mesa structure in the sensor region. A width of the mesa structure is greater than a width of each fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image-sensing structure, comprising:
   a semiconductor substrate having a sensor region and a circuitry region;
   a plurality of fin structures disposed in the circuitry region;
   a mesa structure disposed in the sensor region;
   a first gate structure disposed over the plurality of fin structures in the circuitry region;
   a second gate structure disposed over the mesa structure in the sensor region, wherein the second gate structure covers a portion of sidewalls of the mesa structure;
   a first conductive structure disposed over the first gate structure, wherein the first conductive structure is entirely offset from the plurality of fin structures,
   a second conductive structure disposed over the second gate structure, wherein a width of the second conductive structure is less than a width of the mesa structure,
   wherein the plurality of fin structures and the mesa structure comprise a same semiconductor material.

2. The semiconductor image-sensing structure of claim 1, wherein the width of the mesa structure is greater than a width of each fin structure.

3. The semiconductor image-sensing structure of claim 1, further comprising:
   a plurality of first source/drain structures disposed at two sides of the first gate structure in the circuitry region; and
   a second source/drain structure disposed at two sides of the second gate structure in the sensor region.

4. The semiconductor image-sensing structure of claim 3, wherein the plurality of first source/drain structures and the second source/drain structure comprise n-doped epitaxial structures, and heights of the first source/drain structures are greater than a height of the second source/drain structure.

5. The semiconductor image-sensing structure of claim 3, wherein the plurality of first source/drain structures and the second source/drain structure comprise p-doped epitaxial structures, and heights of the first source/drain structures are less than a height of the second source/drain structure.

6. The semiconductor image-sensing structure of claim 1, further comprising an isolation structure disposed over the semiconductor substrate.

7. The semiconductor image-sensing structure of claim 6, wherein the mesa structure comprises a lower portion abut to the isolation structure, and an upper portion abut the second gate structure.

8. The semiconductor image-sensing structure of claim 1, wherein the first conductive structure entirely overlaps the first gate structure.

9. The semiconductor image-sensing structure of claim 1, wherein the second conductive structure entirely overlaps the second gate structure, and the second conductive structure entirely overlaps the mesa structure or is entirely offset from the mesa structure.

10. The semiconductor image-sensing structure of claim 1, further comprising:
    a first spacer disposed over sidewalls of the first gate structure; and
    a second spacer disposed over sidewalls of the second gate structure,
    wherein a width of the first spacer is less than a width of the second spacer.

11. The semiconductor image-sensing structure of claim 1, further comprising:
    a first spacer disposed over sidewalls of the first gate structure; and
    a second spacer disposed over sidewalls of the second gate structure,
    wherein a width of the first spacer is similar to a width of the second spacer.

12. A semiconductor image-sensing structure, comprising:
    a plurality of FinFET devices, wherein each of the plurality of FinFET devices comprises a plurality of fin structures and a gate structure over the plurality of fin structures;
    a transistor device comprising a mesa structure and a gate structure over the mesa structure;
    an isolation structure separating the fin structures from the mesa structure, wherein a topmost surface of the isolation structure is lower than a top surface of the mesa structure;
    a first conductive structure disposed over the gate structure of at least one of the plurality of FinFET devices, wherein the first conductive structure is entirely offset from the plurality of fin structures of the at least one FinFET devices; and
    a second conductive structure disposed over the gate structure of the transistor device, wherein a width of the second conductive structure is less than a width of the mesa structure,
    wherein the plurality of fin structures and the mesa structure comprise a same material, and the plurality of FinFET devices and the transistor device are electrically connected to form an image-sensing element,
    wherein the width of the mesa structure is greater than a width of each fin structure.

13. The semiconductor image-sensing structure of claim 12, wherein the plurality of FinFET devices and the transistor device are electrically connected to form a 4T image-sensing element.

14. The semiconductor image-sensing structure of claim 13, wherein the plurality of FinFET devices include a reset transistor device, a source follower transistor device, and a selector transistor device.

15. The semiconductor image-sensing structure of claim 13, wherein the transistor device comprises a transfer transistor device.

16. The semiconductor image-sensing structure of claim 15, further comprising a photodiode disposed in the mesa structure.

17. A method for forming a semiconductor image-sensing structure, comprising:
    receiving a semiconductor substrate having a hard mask layer formed thereon, wherein a circuitry region and a sensor region are defined in the semiconductor substrate;
    forming a plurality of first patterned masks in the circuitry region;
    forming a second patterned mask in the sensor region;
    transferring the plurality of first patterned masks and the second patterned mask to the hard mask layer to form a patterned hard mask,
    etching the semiconductor substrate through the patterned hard mask to form a plurality of fin structures in the circuitry region and a mesa structure in the sensor region;
    removing the patterned hard mask; and
    forming an isolation structure over the semiconductor substrate after the removing of the patterned hard mask, wherein a portion of sidewalls of the mesa structure are exposed through the isolation structure, wherein a width of the mesa structure is greater than a width of each fin structure.

18. The method of claim 17, further comprising:

forming a first gate structure over the plurality of fin structures and a second gate structure over the mesa structure;

forming a first spacer over sidewalls of the first gate structure and a second spacer over sidewalls of the second gate structure;

removing portions of each fin structure to form a plurality of first recesses and removing portions of the mesa structure to form a plurality of second recesses; and forming a plurality of first epitaxial structures in the first recesses and a plurality of second epitaxial structures in the second recesses.

19. The method of claim 18, wherein heights of the first epitaxial structures are different from heights of the second epitaxial structures.

20. The method of claim 18, wherein a width of the first spacer is different from a width of the second spacer.

* * * * *